(12) United States Patent
Xie et al.

(10) Patent No.: US 8,362,115 B2
(45) Date of Patent: Jan. 29, 2013

(54) EPOXY RESIN COMPOSITION

(75) Inventors: Guangchao Xie, Jiangsu (CN); Xingming Cheng, Jiangsu (CN)

(73) Assignee: Henkel (China) Investment Company Ltd., Shanghai (CN)

( * ) Notice: Subject to any disclaimer, the term of this patent is extended or adjusted under 35 U.S.C. 154(b) by 0 days.

(21) Appl. No.: 13/249,416

(22) Filed: Sep. 30, 2011

(65) Prior Publication Data
US 2012/0077904 A1 Mar. 29, 2012

Related U.S. Application Data

(63) Continuation of application No. PCT/CN2010/071268, filed on Mar. 24, 2010.

(30) Foreign Application Priority Data

Apr. 1, 2009 (CN) .......................... 2009 1 0048710

(51) Int. Cl.
C08L 63/00 (2006.01)
H01L 23/29 (2006.01)
C08G 59/14 (2006.01)
C08K 5/00 (2006.01)

(52) U.S. Cl. ........ 523/443; 523/400; 523/435; 523/445; 523/457; 525/524

(58) Field of Classification Search .................. 525/524; 523/400

See application file for complete search history.

(56) References Cited

U.S. PATENT DOCUMENTS

| 6,248,454 | B1 | 6/2001 | Ikemura |
| 6,387,537 | B1* | 5/2002 | Umika .......................... 428/620 |
| 2006/0214153 | A1* | 9/2006 | Ikezawa et al. .................. 257/40 |
| 2007/0029682 | A1 | 2/2007 | Aoki et al. |
| 2007/0254986 | A1* | 11/2007 | Tendou et al. ................. 523/440 |
| 2008/0064791 | A1 | 3/2008 | Zenbutsu |

* cited by examiner

FOREIGN PATENT DOCUMENTS

| CN | 1583876 A | 2/2005 |
| JP | 2006176555 A | 7/2006 |

OTHER PUBLICATIONS

Computer generated English translation of JP 2006-176555 A, Kotani, Takahiro, Jul. 6, 2006.*

*Primary Examiner* — Peter F Godenschwager
*Assistant Examiner* — David Karst
(74) *Attorney, Agent, or Firm* — Jane E. Gennaro

(57) ABSTRACT

The present invention provides an epoxy resin composition comprising epoxy resin, phenolic resin, a cure accelerator and an inorganic filler; said epoxy resin comprises: (1) 20-50% of Formula I; (2) 10-40% of Formula II; and (3) 0-30% of Formula III and/or 0-40% of Formula IV, wherein Formula III and Formula IV are not 0% simultaneously; and wherein, $R_1$ and $R_2$ are independently hydrogen or alkyl of $C_1$-$C_6$; n is an integer from 0 to 50 in Formula I; the ratio of the number of phenolic hydroxyls in said phenolic resin to the number of epoxy groups in the epoxy resin mixture is 0.8-1.3; all said percentages are percentages relative to the total mass of the epoxy resin mixture.

The contact area between the epoxy resin composition and the framework is 0.784sq.in Tensile direction Formula I
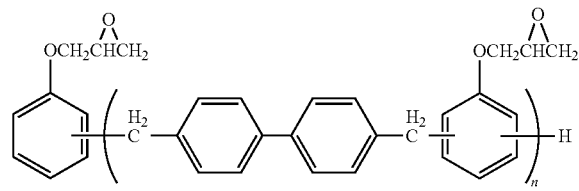
Formula II
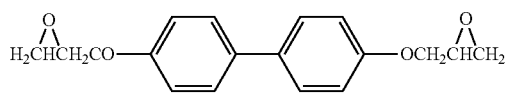
-continued
Formula III
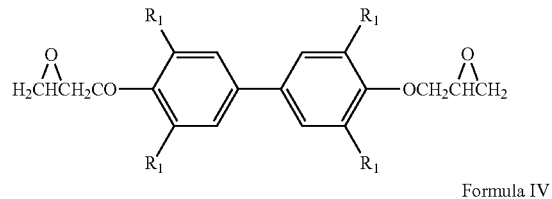
Formula IV
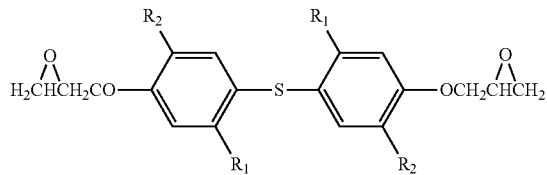
12 Claims, 1 Drawing Sheet

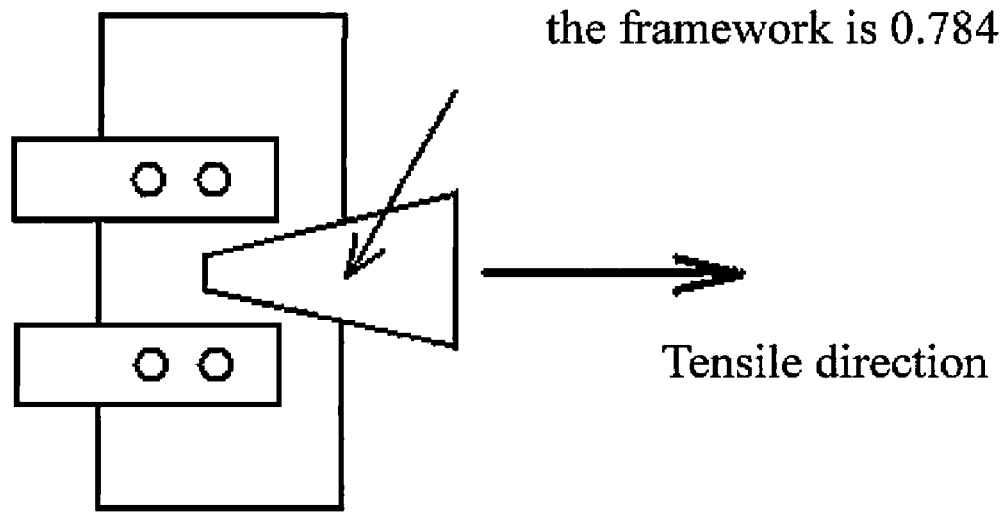

EPOXY RESIN COMPOSITION

CROSS-REFERENCE TO RELATED APPLICATIONS

This application is a continuation of International Patent Application No. PCT/CN2010/071268 filed Mar. 24, 2010 which claims priority to Chinese Patent Application No. 200910048710.0 filed Apr. 1, 2009, the contents of both of which are incorporated herein by reference.

FIELD OF THE INVENTION

The present invention relates to an epoxy resin composition.

DESCRIPTION OF BACKGROUND

As a semiconductor encapsulating material, the flame-retardancy of an epoxy resin composition must achieve UL-94V-0 level of the quality standard for flame-retardance. In the prior art, in order to achieve this quality standard, the main method is adding a certain amount of a flame retardant. There are multiple flame retardants being used presently, and traditionally (non-environmentally), bromine flame retardants and antimony flame retardants are mainly used. However, along with the strengthening of global environmental awareness, various countries proposed Environmental Protection Act in succession, restricting the use of bromide-containing flame retardants and hazardous substances containing lead and so on in electronic products. In early 90s of last century, countries such as America, European countries and Japan etc. realized that, with the rapid development of electronic industry, the hazards of the wastes of industrial products, particularly the lead in lead-tin solders which are annually consumed in large amounts, must be devoted much attention. Presently, China has been one of the major exporters of household appliances in the world; Chinese electronic products, if entering into the international market, would be subjected to the restrictions of limiting laws such as ROHS etc. with the limitation to hazardous substances in electronic products. According to the requirements of the "Restriction of Hazardous Substances" issued by the European Parliament and Council, commercially available electronic information products within the national key regulatory directory may not contain hazardous substances such as lead, antimony, mercury, cadmium, hexavalent chromium, polybrominated biphenyl (PBB) or polybrominated diphenyl ether (PBDE) etc. in China since Jul. 1, 2006. Therefore, the traditional bromine flame retardants and antimony flame retardants will be gradually replaced by an environment-friendly flame retardant, whereas the flame-retardant effect of presently used environment-friendly flame retardants cannot compete with the performance of Br/Sb flame retardants, which need to be added in a larger amount to achieve the flame-retardant requirement. However, the use of such large amount of a flame retardant will seriously affect the flow properties, molding properties and reliability of an epoxy resin composition.

In semiconductor encapsulation, the transition of high temperature reflux process of traditional lead-containing solder at 240° C. to high temperature reflux process of green, environmentally friendly, lead-free solder at 260° C. puts forward higher demands for the reliability of an epoxy molding compound. Above all, in the encapsulation of a green, environmentally friendly, Quad Flat Non-lead Package (QFN), the epoxy molding compound must satisfy the requirements of the high temperature reflux in the lead-free encapsulating process on reliability, should have properties such as high heat resistance, high adhesion, as well as low water absorption and low stress etc., so as to reduce or avoid the demixing phenomenon between the epoxy molding compound and chip/paddle/framework after the high temperature reflux. Secondly, the epoxy molding compound must further have a lower thermal expansion coefficient, which is matched with the thermal expansion coefficients of the semiconductive encapsulating materials such as chip/paddle/framework etc., to reduce the package warpage phenomenon due to the mismatch of thermal expansion coefficients. Therefore, in QFN encapsulation, an epoxy molding compound must have high reliability and low warpage properties to reduce or avoid undesirable phenomena such as inner demixing and outer warpage of a semiconductor package, etc.

DISCLOSURE OF THE INVENTION

The technical problem to be solved by the present invention is to overcome the defects that a traditional epoxy resin composition is added with a bromine flame retardant or antimony flame retardant and that the current epoxy resin composition is difficult to fulfil the requirements of a lead-free reflux solder due to the addition of a large amount of environment-friendly flame retardants. And thereby the present invention provides a green, environmentally friendly, epoxy resin composition with high reliability and low warpage properties that can satisfy the requirements of the lead-free high temperature reflux process.

The epoxy resin composition of the invention comprises epoxy resin, phenolic resin, a cure accelerator and an inorganic filler; said epoxy resin comprises: (1) the epoxy resin as set forth by Formula I; (2) the epoxy resin as set forth by Formula II; and (3) the epoxy resin as set forth by Formula III and/or Formula IV;

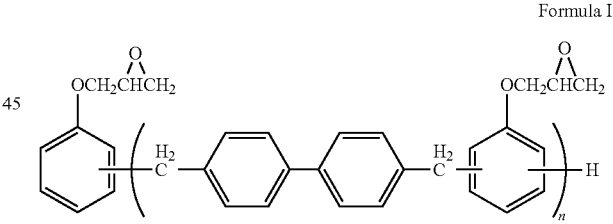

Formula I

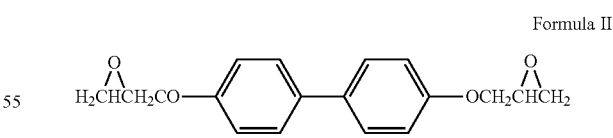

Formula II

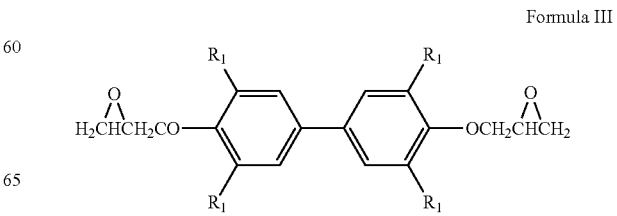

Formula III

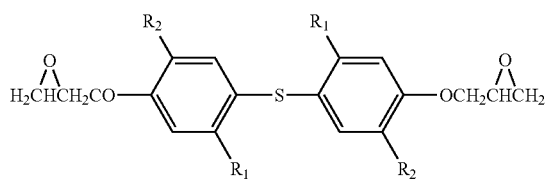

$$\text{Formula IV}$$

wherein, $R_1$ and $R_2$ are independently hydrogen or $C_1$-$C_6$ alkyl, $R_1$ is preferably methyl, $R_2$ is preferably tert-butyl; n is an integer from 0 to 50 in Formula I. The content of the epoxy resin of Formula I is 20-50%, preferably 30-40%; the content of the epoxy resin of Formula II is 10-40%, preferably 15-25%; the content of the epoxy resin of Formula III is 0-30%, preferably 15-25%; the content of epoxy resin of Formula IV is 0-40%, preferably 20-30%; those of Formula III and Formula IV cannot be 0% simultaneously; all percentages of said contents are percentages relative to the total mass of the epoxy resin mixture. The content of said epoxy resin mixture is preferably 3-8% of the epoxy resin composition by mass.

The epoxy resin in the present invention reacts with phenolic resin to form a self-extinguishing network structure of an epoxy resin composition. That is, while the epoxy resin composition is burned, a foamlayer (flame-retardant barrier) will be formed which prevents oxygen to pass and blocks heat transfer to achieve the self-extinguishing effect. Meanwhile, the network formed in the backbone by cured resin compound, which contains multiple sets of aromatic hydrocarbons and has heat resistant decomposition reaction, plays a critical role on foamlayer stability. Such composition has excellent heat resistance and reliability, as well as low water absorption and low stress, which may well satisfy the high temperature and reliability requirements of lead-free solder process, and meanwhile low warpage properties.

The phenolic resin of the present invention is mainly used as a curing agent, and a conventionally used phenolic resin in the art, preferably a low water absorptive phenolic resin and a biphenyl phenolic resin can be selected and used. The ratio of the number of phenolic hydroxyls in said phenolic resin to the number of the epoxy groups in the epoxy resin mixture is 0.8-1.3, preferably 0.9-1.1.

The cure accelerator of the present invention is an imidazole compound. Said imidazole compound refers to imidazole or a compound containing an imidazolyl group, preferably dimethylimidazole; the content of said cure accelerator is preferably less than or equal to 1% of the epoxy resin composition by mass.

The inorganic filler of the present invention can further reduce the water absorption of the epoxy resin composition, and thereby increase the reliability. Said inorganic filler is preferably a composite inorganic filler. Said composite inorganic filler is preferably silicon dioxide; the particle size distribution of said composite inorganic filler is preferably that: 18-24% is less than 3 μm, 20-30% is no more than 3 μm and less than 12 μm, 45-57% is more than or equal to 12 μm and less than 48 μm, 5-17% is more than or equal to 48 μm and less than 75 μm; the percentage is a percentage by which the total mass of the composite inorganic filler is occupied. Said composite inorganic filler preferably has a median particle diameter d50 of 14-20 μm, and preferably has an average particle diameter of 18-24 μm; the content of said composite inorganic filler is preferably 85-89% of the total mass of the epoxy resin composition. The composite inorganic filler using above is a high fill-in technique, which enables the epoxy resin composition of the present invention to retain the good flowability when the filling rate is 85-89%.

In a preferred example of the present invention, said epoxy resin composition further comprises a flame retardant. Said flame retardant is an environment-friendly flame retardant conventionally used in the art, which is preferably one or more of nitrogen-containing, boron-containing and metal hydroxide flame retardants. The content of said flame retardants is preferably less than or equal to 5% of the epoxy resin composition by mass.

According to the requirement of practical application, the epoxy resin composition of the present invention may further comprise other additives, such as one or more of a releasing agent, coupling agent, colouring agent, stress absorbing agent, adhesion promoter and ion trapping agent etc. In a most preferred example of the invention, the epoxy resin of the invention further comprises a releasing agent, coupling agent, colouring agent, stress absorbing agent, adhesion promoter and ion trapping agent. The type and content of each of the additives may be selected according to conventional techniques in the art. Wherein, the coupling agent is used to increase the adhesion of the epoxy resin composition, preventing water to permeate into the chip from the interface between molding compound and framework etc.; the ion trapping agent is used to reduce the content of free ions in the epoxy resin composition.

The present invention further provides a method of preparing said epoxy resin composition: extruding and mixing various components of the epoxy resin composition of the invention in a twin-screw extruder at 100 to 110° C., followed by cooling and crushing to complete the preparation.

All of the raw materials and reagents of the present invention are commercially available.

The positively progressive effects of the present invention are as follows.

1. A bromine-free and antimony-free epoxy resin composition is provided by optimizing the type and ratio of the epoxy resin. Such epoxy resin composition has good flowability, flame retardancy, high heat resistance, high adhesion, low water absorption and low stress and the like, which can not only achieve UL-94V-0 level of the quality standard of for flame-retardance, but also satisfy the high temperature and reliability requirements of a green, environmentally friendly, lead-free solder encapsulating process, having high reliability and low warpage properties, so the epoxy resin composition is an excellent epoxy resin composition for semiconductor encapsulation, especially suitable for the encapsulation of a green, environmentally friendly QFN.

2. In a preferred example of the present invention, the epoxy resin composition of the present invention, when the filling rate is up to 85 to 89%, still has good flowability as well as low water absorption and low stress which may meet the high temperature and reliability requirements of the lead-free solder process better, and meanwhile has low warpage properties, by using the high fill-in process and preferring a composite inorganic filler.

BRIEF DESCRIPTION OF THE DRAWINGS

FIG. 1 is a schematic diagram of the framework for testing the adhesion in the effect example.

SPECIFIC EMBODIMENTS

Hereinafter, the present invention is further described with examples, but not limited thereto.

The molecular formulas of Formula III and Formula IV used in the examples are as follows:

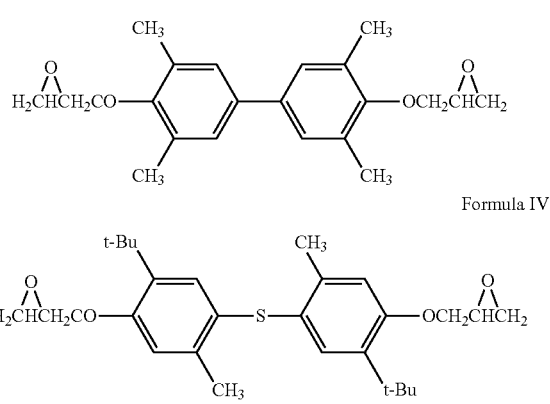

Formula III

Formula IV

The phenolic resin used in the examples is biphenyl phenolic resin; see Formula V, wherein m is an integer of 0 to 15.

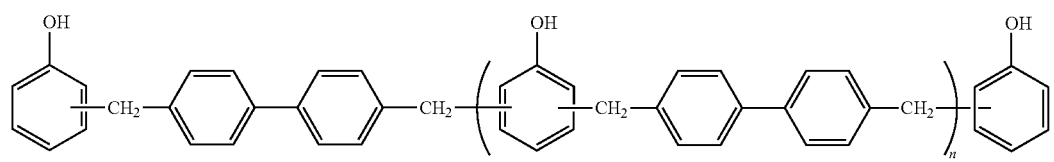

Formula V

Example 1

The formulation of the epoxy resin composition (1000 g) is: epoxy resin: 80 g, wherein Formula (I) accounts for 25 g (n=0), Formula (II) accounts for 5 g, Formula (IV) accounts for 20 g; phenolic novolac resin: 60 g (its equivalence ratio to epoxy resin is 0.8); dimethylimidazole: 10 g; composite inorganic filler, silicon dioxide: 850 g; 18% of said silicon dioxide is less than 3 μm in particle size, 20% is more than or equal to 3 μm and less than 12 μm in particle size, 45% is more than or equal to 12 μm and less than 48 μm in particle size, 17% is more than or equal to 48 μm and less than 75 μm in particle size. The silicon dioxide has a median particle diameter of 20 μm, and an average particle diameter of 24 μm.

During the preparation, above described raw materials are mixed in a twin-screw extruder at 100° C., and then cooled and crushed.

Example 2

The formulation of the epoxy resin composition (1000 g) is: epoxy resin: 30 g, wherein Formula (I) accounts for 12 g (n=15), Formula (II) accounts for 9 g, Formula (III) accounts for 9 g; phenolic novolac resin: 80 g (its equivalence ratio to epoxy resin is 1.3); dimethylimidazole: 10 g; composite inorganic filler, silicon dioxide: 890 g; 24% of said silicon dioxide is less than 3 μm in particle size, 26% is more than or equal to 3 μm and less than 12 μm in particle size, 45% is more than or equal to 12 μm and less than 48 μm in particle size, 5% is more than or equal to 48 μm and less than 75 μm in particle size. The silicon dioxide has a median particle diameter of 14 μm, and an average particle diameter of 18 μm.

During the preparation, above described raw materials are mixed in a twin-screw extruder at 105° C., and then cooled and crushed.

Example 3

The formulation of the epoxy resin composition (1000 g) is: epoxy resin: 40 g, wherein Formula (I) accounts for 8 g (n=50), Formula (II) accounts for 10 g, Formula (III) accounts for 10 g, Formula (IV) accounts for 12 g; phenolic novolac resin: 60 g (its equivalence ratio to epoxy resin is 1.1); dimethylimidazole: 10 g; composite inorganic filler, silicon dioxide: 890 g; 20% of said silicon dioxide is less than 3 μm in particle size, 30% is more than or equal to 3 μm and less than 12 μm in particle size, 45% is more than or equal to 12 μm and less than 48 μm in particle size, 5% is more than or equal to 48 μm and less than 75 μm in particle size. The silicon dioxide has a median particle diameter of 16 μm, and an average particle diameter of 20 μm.

During the preparation, above described raw materials are mixed in a twin-screw extruder at 110° C., and then cooled and crushed.

Example 4

The formulation of the epoxy resin composition (1000 g) is: epoxy resin: 60 g, wherein Formula (I) accounts for 30 g (n=30), Formula (II) accounts for 6 g, Formula (III) accounts for 12 g, Formula (IV) accounts for 12 g; phenolic novolac resin: 60 g (its equivalence ratio to epoxy resin is 0.9); dimethylimidazole: 5 g; composite inorganic filler, silicon dioxide: 875 g: 18% of said silicon dioxide is less than 3 μm in particle size, 20% is more than or equal to 3 μm and less than 12 μm in particle size, 57% is more than or equal to 12 μm and less than 48 μm in particle size, 5% is more than or equal to 48 μm and less than 75 μm in particle size. The silicon dioxide has a median particle diameter of 18 μm, and an average particle diameter of 22 μm.

During the preparation, above described raw materials are mixed in a twin-screw extruder at 105° C., and then cooled and crushed.

Example 5

The formulation of the epoxy resin composition (1000 g) is: epoxy resin: 60 g, wherein Formula (I) accounts for 18 g (n=30), Formula (II) accounts for 15 g, Formula (III) accounts for 9 g, Formula (IV) accounts for 18 g; phenolic novolac resin: 60 g (its equivalence ratio to epoxy resin is 1.0); dimethylimidazole: 5 g; composite inorganic filler, silicon dioxide: 850 g; 20% of said silicon dioxide is less than 3 μm in particle size, 22% is more than or equal to 3 μm and less than 12 μm in particle size, 57% is more than or equal to 12 μm and less than 48 μm in particle size, 10% is more than or equal to 48 μm and less than 75 μm in particle size. The silicon dioxide has a median particle diameter of 16 μm, and an average particle diameter of 20 μm; colouring agent, carbon black: 3 g; releasing agent, canauba wax: 5 g; coupling agent: epoxy silane 6 g; flame retardant: zinc borate 11 g.

During the preparation, above described raw materials are mixed in a twin-screw extruder at 105° C., and then cooled and crushed.

Example 6

The formulation of the epoxy resin composition (1000 g) is: epoxy resin: 40 g, wherein Formula (I) accounts for 14 g (n=12), Formula (II) accounts for 6 g, Formula (III) accounts for 8 g, Formula (IV) accounts for 12 g; phenolic novolac resin: 35 g (its equivalence ratio to epoxy resin is 1.0); dimethylimidazole: 5 g; composite inorganic filler, silicon dioxide: 856 g; 20% of said silicon dioxide is less than 3 μm in particle size, 22% is more than or equal to 3 μm and less than 12 μm in particle size, 57% is more than or equal to 12 μm and less than 48 μm in particle size, 10% is more than or equal to 48 μm and less than 75 μm in particle size. The silicon dioxide has a median particle diameter of 16 μm, and an average particle diameter of 20 μm; colouring agent, carbon black: 3 g; releasing agent, canauba wax: 5 g; coupling agent, epoxy silane: 6 g; flame retardant, aluminum hydroxide: 50 g.

During the preparation, above described raw materials are mixed in a twin-screw extruder at 105° C., and then cooled and crushed.

Example 7

The formulation of the epoxy resin composition (1000 g) is: epoxy resin: 40 g, wherein Formula (I) accounts for 14 g (n=12), Formula (II) accounts for 6 g, Formula (III) accounts for 8 g, Formula (IV) accounts for 12 g; phenolic novolac resin: 35 g (its equivalence ratio to epoxy resin is 1.0); dimethylimidazole: 5 g; composite inorganic filler, silicon dioxide: 870 g; 20% of said silicon dioxide is less than 3 μm in particle size, 22% is more than or equal to 3 μm and less than 12 μm in particle size, 57% is more than or equal to 12 μm and less than 48 μm in particle size, 10% is more than or equal to 48 μm and less than 75 μm in particle size. The silicon dioxide has a median particle diameter of 16 μm, and an average particle diameter of 20 μm; colouring agent, carbon black: 3 g; releasing agent, canauba wax: 5 g; coupling agent, epoxy silane: 6 g; flame retardant, melamine: 30 g; stress absorbing agent, polysiloxane silicone oil: 2 g; bonding accelerator, mercaptosilane: 2 g; ion trapping agent: 2 g.

During the preparation, above described raw materials are mixed in a twin-screw extruder at 105° C., and then cooled and crushed.

Example 8

The formulation of the epoxy resin composition (1000 g) is: epoxy resin: 45 g is selected and used, wherein Formula (I) accounts for 12 g (n=4), Formula (II) accounts for 9 g, Formula (III) accounts for 10 g, Formula (IV) accounts for 9 g; phenolic novolac resin: 40 g; imidazole cure accelerator (dimethylimidazole): 2 g; composite inorganic filler, silicon dioxide: 890 g, having the particle size distribution that particles less than 3 μm account for 22%, particles more than or equal to 3 μm and less than 12 μm account for 18%, particles more than or equal to 12 μm and less than 48 μm account for 48%, particles more than or equal to 48 μm and less than 75 μm account for 12%; the silicon dioxide has a median particle diameter d50 of 18 μm, and an average particle diameter of 22 μm; colouring agent, carbon black: 3 g; releasing agent, canauba wax: 5 g; coupling agent, epoxy silane: 6 g; flame retardant, melamine: 3 g; stress absorbing agent, polysiloxane silicone oil: 2 g; bonding accelerator, mercaptosilane: 2 g; ion trapping agent: 2 g.

During the preparation, above described raw materials are mixed on the twin-screw extruder at 105° C., and then cooled and crushed.

Example 9

The formulation of the epoxy resin composition (1000 g) is: epoxy resin: 55 g, wherein Formula (I) accounts for 24 g (n=8), Formula (II) accounts for 15 g, Formula (IV) accounts for 16 g; phenolic novolac resin: 40 g; imidazole cure accelerator (dimethylimidazole): 2 g; composite inorganic filler (the same as Example 8): 885 g; colouring agent, carbon black: 3 g; releasing agent, canauba wax: 5 g; coupling agent, epoxy silane: 6 g; flame retardant, melamine: 3 g; stress absorbing agent, polysiloxane silicone oil: 2 g; bonding accelerator, mercaptosilane: 2 g; ion trapping agent: 2 g in use.

During the preparation, above described raw materials are mixed in a twin-screw extruder at 105° C., and then cooled and crushed.

Example 10

The following are in use: epoxy resin: 55 g, wherein Formula (I) accounts for 20 g (n=18), Formula (II) accounts for 24 g, Formula (III) accounts for 11 g; phenolic novolac resin: 40 g; imidazole cure accelerator (dimethylimidazole): 2 g; composite inorganic filler (the same as Example 8): 885 g; colouring agent, carbon black: 3 g; releasing agent, canauba wax: 5 g; coupling agent, epoxy silane: 6 g; flame retardant, melamine: 3 g; stress absorbing agent, polysiloxane silicone oil: 2 g; bonding accelerator, mercaptosilane: 2 g; ion trapping agent: 2 g.

During the preparation, above described raw materials are mixed in a twin-screw extruder at 105° C., and then cooled and crushed.

Example 11

The following are in use: epoxy resin: 45 g is selected and used, wherein Formula (I) accounts for 8 g (n=20), Formula (II) accounts for 14 g, Formula (III) accounts for 10 g, Formula (IV) accounts for 13 g; phenolic novolac resin: 40 g; imidazole cure accelerator (dimethylimidazole): 2 g; composite inorganic filler (the same as Example 8): 890 g; colouring agent, carbon black: 3 g; releasing agent, canauba wax: 5 g; coupling agent, epoxy silane: 6 g; flame retardant, melamine: 3 g; stress absorbing agent, polysiloxane silicone oil: 2 g; bonding accelerator, mercaptosilane: 2 g; ion trapping agent: 2 g.

During the preparation, above described raw materials are mixed in a twin-screw extruder at 105° C., and then cooled and crushed.

Effect Example

The epoxy resin composition in the Effect Example is prepared according to Examples 8 to 11.

I. Tests of the epoxy resin composition prepared according to Examples 8 to 11 for main performance indexes:
1. gelation time (GT): HW/ZL/JS015-HPGT
2. spiral flow length (SF): HW/ZL/JS015-SF
3. ash (Ash): HW/ZL/JS015-ASH 4. flame retardancy (UL 94): HW/ZL/JS015-UL
5. water absorption (PCT24): 121C/100%/24H
6. glass transition temperature/thermal expansion coefficient (Tg/CTE1&2): HW/ZL/JS015TMA
7. Adhesion: the epoxy resin composition is encapsulated on a framework designed as FIG. 1, wherein the contact area between the epoxy resin composition and the framework is 0.784 sq.in, and post-cured in an oven at 175° C. for 6 hours, and further, subjected to a moisture absorption treatment under the condition of JEDEC MSL3 (30° C./60%/168 h), and then, the treated sample is refluxed for 3 times under the condition of 260° C. Finally, the adhesion between the epoxy resin composition and metal framework is tested by a tension tester. The testing results are shown in Table 1.

II. Tests of the epoxy resin compositions prepared according to Examples 8 to 11 for reliability and warpage properties in semiconductive package.

1. Demixing reliability: the samples is encapsulated on QFN 7×7 mm Cu/Ag and Ni/Pa/Au (PPF) frameworks, respectively, and the encapsulated sample is post-cured at 175° C. for 6 hours, followed by 3 times of reflux pre-treatment under JEDEC MSL1 (85/85/100%)/260° C., and then, the inner demixing situation of QFN package is scanned by C-sam.

2. Package warpage properties: the sample is packaged on QFN 7×7 mm, and then, warpage test is performed by the method of Shadow Morrie.

The testing results are shown in Table 2.

TABLE 1

| | Item | Example 8 | Example 9 | Example 10 | Example 11 | The current product |
|---|---|---|---|---|---|---|
| Main performance index parameters | GT, s | 30 | 24 | 23 | 22 | 40 |
| | SF, inch | 34 | 37 | 23 | 32 | 42 |
| | Ash, % | 89 | 88.5 | 88.5 | 89 | 88 |
| | UL 94 | V-0 | V-0 | V-0 | V-0 | V-0 |
| | PCT24, % | 0.28 | 0.26 | 0.25 | 0.29 | 0.27 |
| | Tg, °C. | 102 | 97 | 102 | 106 | 130 |
| | CTE1 | 8 | 9 | 7 | 9 | 9 |
| | CTE2 | 32 | 34 | 27 | 31 | 34 |
| | bond to copper | 423 | 456 | 442 | 398 | 382 |
| | bond to silver | 176 | 278 | 321 | 196 | 251 |
| | bond to PPF | 120 | 230 | 113 | 98 | 167 |

TABLE 2

| Items | | | Example 8 | Example 9 | Example 10 | Example 11 | The current product |
|---|---|---|---|---|---|---|---|
| Demixing (QFN 7 × 7 mm) | Cu/Ag framework | chip | 0/10 | 0/10 | 0/10 | 0/10 | 0/10 |
| | | paddle | 2/10 | 1/10 | 0/10 | 4/10 | 2/10 |
| | | framework | 0/10 | 0/10 | 0/10 | 0/10 | 0/10 |
| | PPF framework | chip | 0/10 | 0/10 | 0/10 | 0/10 | 0/10 |
| | | paddle | 4/10 | 0/10 | 3/10 | 6/10 | 1/10 |
| | | framework | 0/10 | 0/10 | 0/10 | 0/10 | 0/10 |
| warpage (QFN 7 × 7 mm) | | | 0.24 mm | 0.32 mm | 0.26 mm | 0.22 mm | 0.31 mm |

In Table 2, before "/" is the number of failed samples, and behind "/" is the total number of samples.

It can be seen from Table 1 and Table 2 that, each of the epoxy resin compositions of the present invention has better reliability and warpage properties. In particular, those of Example 9 on PPF pass Grade 1 assessment, and those of Example 10 on Cu/Ag pass Grade 1 assessment.

The invention claimed is:

1. An epoxy resin composition comprising epoxy resin, phenolic resin, cure accelerator and inorganic filler, said epoxy resin comprising:
   (1) 20-50% of Formula I;
   (2) 10-40% of Formula II; and
   (3) 0-30% of Formula III and/or 0-40% of Formula IV, wherein Formula III and Formula IV are not 0% simultaneously;

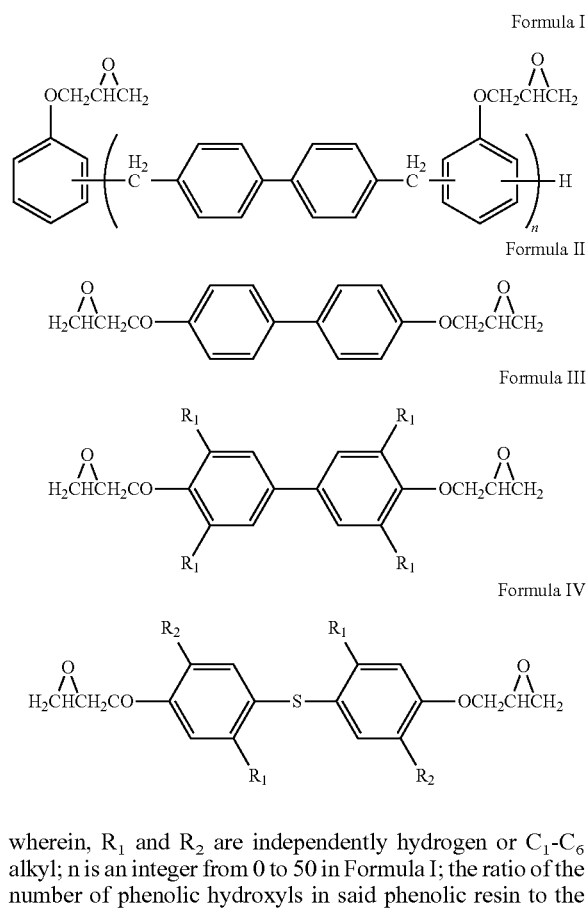

wherein, $R_1$ and $R_2$ are independently hydrogen or $C_1$-$C_6$ alkyl; n is an integer from 0 to 50 in Formula I; the ratio of the number of phenolic hydroxyls in said phenolic resin to the number of epoxy groups in the epoxy resin mixture is 0.8-1.3; all of said percentages are percentages relative to the total mass of the epoxy resin mixture characterized in that said inorganic filler is a composite inorganic filler, wherein, said composite inorganic filler is silicon dioxide; the particle size distribution of said composite inorganic filler is as follows: 18-24% is less than 3 µm, 20-30% is more than or equal to 3 µm and less than 12 µm, 45-57% is more than or equal to 12 µm and less than 48 µm, 5-17% is more than or equal to 48 µm and less than 75 µm, wherein the percentage is a percentage by which the total mass of the composite inorganic filler is occupied, and wherein said composite inorganic filler has a median particle diameter of 14-20 µm, and an average particle diameter of 18-24 µm.

2. The epoxy resin composition of claim 1, characterized in that said $R_1$ is methyl, said $R_2$ is tert-butyl.

3. The epoxy resin composition of claim 1, characterized in that the content of Formula I is 30-40%; the content of Formula II is 15-25% wherein all percentages of said content are percentages relative to the total mass of the epoxy resin mixture.

4. The epoxy resin composition of claim 1, characterized in that the content of Formula III is 15-25% wherein all percentages of said content are percentages relative to the total mass of the epoxy resin mixture.

5. The epoxy resin composition of claim 1, characterized in that the content of Formula IV is 20-30% wherein all percentages of said content are percentages relative to the total mass of the epoxy resin mixture.

6. The epoxy resin composition of claim 1, characterized in that the content of said epoxy resin is 3-8% of the epoxy resin composition by mass.

7. The epoxy resin composition of claim 1, characterized in that the ratio of the number of phenolic hydroxyls in said phenolic resin to the number of epoxy groups in the epoxy resin mixture is 0.9-1.1.

8. The epoxy resin composition of claim 1, characterized in that said cure accelerator is an imidazole compound.

9. The epoxy resin composition of claim 1, characterized in that the content of said cure accelerator is less than or equal to 1% of the epoxy resin composition by mass.

10. The epoxy resin composition of claim 1, characterized in that the content of said inorganic filler is 85-89% of the epoxy resin composition by mass.

11. The epoxy resin composition of claim 1, characterized in that said epoxy resin composition further comprises one or more of a flame retardant, releasing agent, coupling agent, colouring agent, stress absorbing agent, adhesion promoter and ion trapping agent.

12. The epoxy resin composition of claim 11, characterized in that said flame retardant is one or more of nitrogen-containing, boron-containing and metal hydroxide flame retardants and the content of said flame retardants is less than or equal to 5% of the epoxy resin composition by mass.

* * * * *